(12) United States Patent
Jefferies et al.

(10) Patent No.: US 10,132,697 B2
(45) Date of Patent: Nov. 20, 2018

(54) CURRENT TRANSFORMER WITH ENHANCED TEMPERATURE MEASUREMENT FUNCTIONS

(71) Applicant: SCHNEIDER ELECTRIC USA, INC., Schaumburg, IL (US)

(72) Inventors: Kevin M. Jefferies, Raleigh, NC (US); Benjamin W. Edwards, Rolesville, NC (US); Matthew L. White, Raleigh, NC (US); Konstantin Alexander Filippenko, Grenoble (FR); Richard Karl Weiler, Wake Forest, NC (US)

(73) Assignee: Schneider Electric USA, Inc., Andover, MA (US)

( * ) Notice: Subject to any disclaimer, the term of this patent is extended or adjusted under 35 U.S.C. 154(b) by 410 days.

(21) Appl. No.: 14/757,395

(22) Filed: Dec. 23, 2015

(65) Prior Publication Data

US 2017/0184458 A1 Jun. 29, 2017

(51) Int. Cl.
| | |
|---|---|
| *G01K 1/00* | (2006.01) |
| *G01K 13/00* | (2006.01) |
| *G01K 7/16* | (2006.01) |
| *G01R 19/00* | (2006.01) |
| *G01R 1/20* | (2006.01) |
| *G01R 11/25* | (2006.01) |

(Continued)

(52) U.S. Cl.
CPC ............... *G01K 7/16* (2013.01); *G01R 1/203* (2013.01); *G01R 11/25* (2013.01); *G01R 15/14* (2013.01); *G01R 15/183* (2013.01); *G01R 19/0092* (2013.01); *G01R 21/133* (2013.01); *G01R 21/14* (2013.01); *G01R 31/027* (2013.01); *G01R 35/04* (2013.01)

(58) Field of Classification Search
USPC .............................................. 374/152, 1, 141
See application file for complete search history.

(56) References Cited

U.S. PATENT DOCUMENTS

| | | | |
|---|---|---|---|
| 4,567,419 A | | 1/1986 | Watanabe |
| 4,849,677 A | * | 7/1989 | Kruger ..................... H02H 5/04 |
| | | | 318/473 |

(Continued)

FOREIGN PATENT DOCUMENTS

| | | |
|---|---|---|
| EP | 2746790 | 6/2014 |
| EP | 3023806 | 5/2016 |
| JP | 09-5368 | 1/1997 |

OTHER PUBLICATIONS

English Language Abstract of Japanese Patent Application Publication No. JP09-5368, published Jan. 10, 1997, 1 page.

(Continued)

*Primary Examiner* — Mirellys Jagan
(74) *Attorney, Agent, or Firm* — Locke Lord LLP

(57) ABSTRACT

The present invention provides a method of using a current transformer for a temperature sensing device. The method determines the temperature of the current transformer's secondary winding by injecting a DC current into the secondary winding, measuring a voltage across the secondary winding, calculating the resistance of the secondary winding from the voltage induced into the secondary winding by the injected DC current and determining the secondary winding temperature by calculations or a comparison with verified resistance/temperature combinations.

18 Claims, 5 Drawing Sheets

(51) Int. Cl.
  *G01R 35/04* (2006.01)
  *G01R 15/14* (2006.01)
  *G01R 15/18* (2006.01)
  *G01R 21/133* (2006.01)
  *G01R 21/14* (2006.01)
  *G01R 31/02* (2006.01)

(56) References Cited

U.S. PATENT DOCUMENTS

| | | | |
|---|---|---|---|
| 5,708,336 A | 1/1998 | Eyerly et al. | |
| 6,817,760 B2* | 11/2004 | Mende | G01K 7/42 324/117 H |
| 2004/0101027 A1* | 5/2004 | Mende | G01K 7/183 374/152 |
| 2014/0191774 A1* | 7/2014 | Muller | G01R 27/14 324/713 |
| 2014/0200843 A1* | 7/2014 | Shamir | G01R 21/133 702/107 |
| 2014/0253102 A1 | 9/2014 | Wood et al. | |
| 2014/0285180 A1* | 9/2014 | Foote | H03H 11/52 324/105 |
| 2016/0197545 A1* | 7/2016 | Nemoto | G01R 19/0092 363/78 |
| 2017/0122995 A1* | 5/2017 | Voisine, Jr. | G01N 25/72 |

OTHER PUBLICATIONS

Extended European Search Report dated May 19, 2017 for European Patent Application No. 16204520.7, 15 pages.

\* cited by examiner

CURRENT TRANSFORMER WITH ENHANCED TEMPERATURE MEASUREMENT FUNCTIONS

FIELD OF THE INVENTION

The invention is generally directed current transformers and particularly to additional sensing that can be derived from a current transformer.

BACKGROUND OF THE INVENTION

FIG. 1 illustrates a typical current transformer (CT) of the prior art, generally indicated by reference numeral 10. The CT includes a primary winding 14, which carries current from a power source 18 to a load 22, and a secondary winding 26, which receives an induced current from the primary winding 14. The secondary winding 26 is connected to a measuring/monitoring device 30, which could be a protection device such as a circuit breaker, overload relay or other device capable of interpreting an induced current signal received from in the secondary winding 26. If the induced current signal from the secondary winding 26 indicates that current in the primary winding 14 has exceeded a predetermined level the monitoring device 30 can initiate an interruption of current flow in the primary winding 14. In more sophisticated protection devices the monitoring device 30 can include a memory 34 for storing algorithms 38 used by at least one processor 42 to interpret the induced current signal from the secondary winding 26, determine if current flow in the primary winding 14 exceeds the predetermined level and initiate the interruption of current flow in the primary winding 14.

Current transformers, as described above, are widely used in protection systems to monitor load currents. In many applications CTs are placed in areas where the temperature can vary enough to affect the accuracy of the CT. In critical applications where accuracy of the CT is extremely important a temperature sensing device can be installed near the CT to provide local temperature information. The CT monitoring equipment can use the local temperature information to compensate for the temperature's effect on the CT. This requires installing the temperature measuring device and connecting it to the CT monitoring equipment, which adds additional cost for the temperature sensing equipment and its installation. In some instances the CTs are installed inside small enclosures that do not have room for additional sensing devices or in locations that are difficult to access. In these situations the temperature sensing device may not be close enough to the CT to provide accurate local temperature readings that can be used to increase the accuracy of the CT. Therefore, having a temperature sensing device that is actually an integral part of the CT would be beneficial.

SUMMARY OF THE INVENTION

The present invention uses certain characteristics of current transformers (CTs) and the addition of a DC current circuit and a voltage measuring circuit to obtain temperature information from the CT. Essentially the CT is modified to function as both a current transformer and a temperature sensor. With the additional temperature information the measuring/monitoring circuit of the CT can perform additional diagnostic functions that are not easily accomplished without temperature information, including, but not limited to, determining if the CT has a temperature related accuracy issue or if there is a possible loose electrical connection or arcing in the primary circuit. These new diagnostic functions can provide an early warning for possible events in the primary circuit that could result in lost time or equipment damage. The modified current transformer of the present invention provides a system for obtaining both current and temperature information comprising:

a current transformer having a primary winding and a secondary winding;

a circuit for injecting a DC current into the secondary winding;

a circuit for measuring a voltage across the secondary winding;

a processor for calculating a resistance of the secondary winding from the measured voltage;

a memory for storing the calculated resistance of the secondary winding;

determining, by the processor, a temperature of the secondary winding; and storing the determined temperature of the secondary winding in the memory for diagnostic use by the processor.

The present invention also provides a method of determining the temperature of a current transformer's secondary winding comprising the step of:

injecting a direct current (DC) into the secondary winding of the CT;

measuring a voltage across the secondary winding induced by the injected DC current;

calculating, by a processor, a resistance of the secondary winding from the measured voltage;

determining, by the processor, a temperature of the secondary winding; and storing the determined temperature of the secondary winding in a memory for future diagnostic use by the processor.

DETAILED DESCRIPTION OF THE EMBODIMENTS

Figure 1:
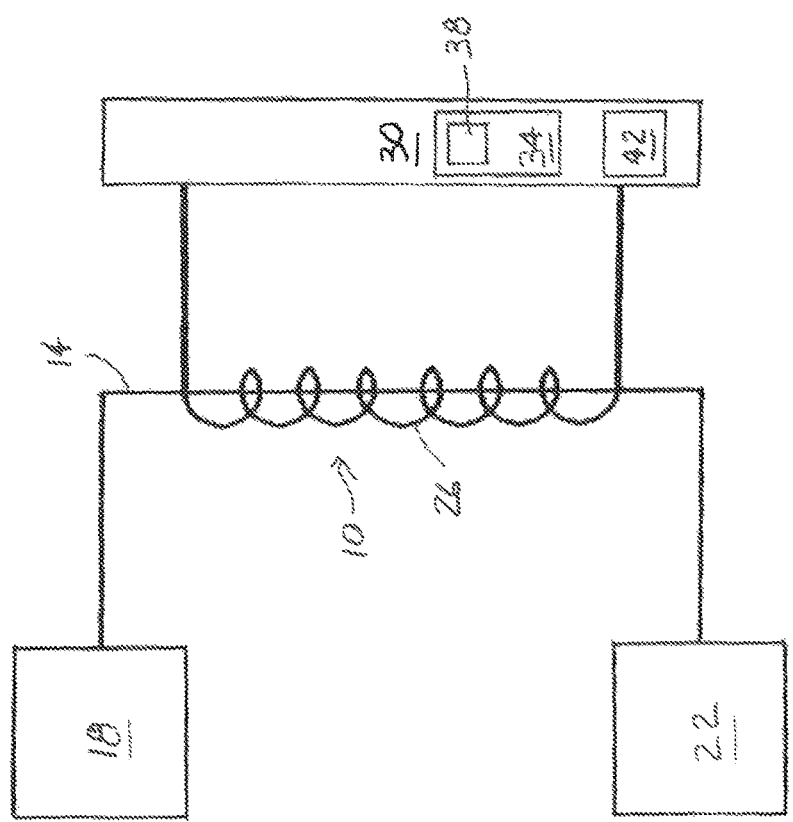
FIG. 1 illustrates a typical current transformer for measuring current in an electrical conductor.
Figure 2:
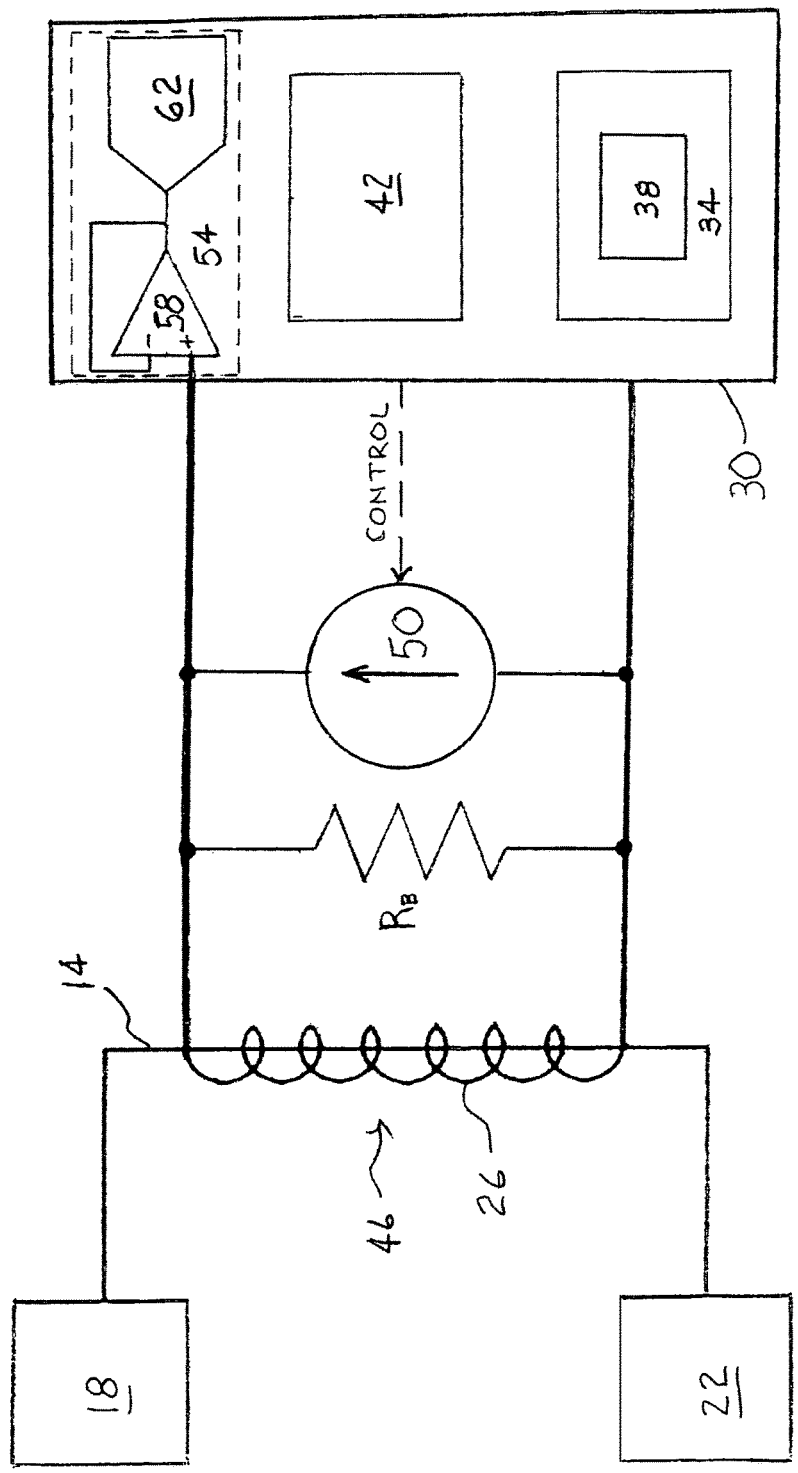
FIG. 2 illustrates a current transformer of the present invention which senses both current and temperature.

Referring now to FIG. 2, a CT of the present invention, generally indicated by reference numeral 46 is shown. As in the prior art CT 10 of FIG. 1, a primary winding 14 carries current from a power source 18 to a load 22, and induces current into the secondary winding 26 where it is measured by the measuring/monitoring device 30. The CT 46 of the present invention includes a DC current circuit 50, a voltage measurement circuit 54, consisting of a buffer 58 and an analogue to digital converter (ADC) 62, a memory 34 for storing reference data, historic data and algorithms 38 and one of more processors 42. Reference data can include, but is not limited to, CT design/material data, lookup tables, resistance/temperature relationships and verified test data. Historic data can include, but is not limited to, past resistance data, voltage data, temperature data, expected temperatures based on sensed currents, and diagnostic results. The DC current circuit 50 can be controlled by the measuring/monitoring device 30 such that the injected DC current can be turned off, increased or decreased as required to increase measurement accuracy. The processor 42 uses the algorithms 38, reference data and measured data to determine the temperature of the secondary winding 26. Using the superposition electrical theorem, the ADC 62 can measure current sensor output current*burden resistance $R_B$ and current source*(burden resistance $R_B$ I current sensor 46 winding 26 resistance). Knowing the burden resistance $R_B$ and the output of the current source 50, the resistance of the current sensor 46 winding 26 can be calculated. Alternatively, the resistance of the secondary winding 26 can be calculated from information about the voltage induced by the DC current circuit 50. Once the resistance of the secondary winding 26 is known the temperature can be determined based on characteristics of the CT 46 design (relationships between resistance and temperature based on materials used in the CT 46 and stored in memory 34). A resistance/temperature relationship table created by measuring secondary winding 26 resistances at verified temperatures can also be used to determine the temperature of secondary winding 26. The resistance/temperature table can also be used as a calibration parameter if there is a temperature initiated CT 46 sensing error.

Once the induced voltage, resistance and temperature of the secondary winding 26 have been determined and stored in memory 34, the processor 42 can evaluate the accuracy of the induced current signal from the secondary winding 26 by comparing the determined secondary winding 26 temperature with previously determined secondary winding 26 temperatures known to produce CT sensing errors and compensate accordingly for any temperature related error. Compensating can be accomplished by comparing the sensed current believed to be in error with historic resistance/temperature data or verified resistance/temperature test data and other stored characteristics of the CT 46 to determining a correction factor that can be used to compensate for the temperature related current sensing error. The ability to compensate for temperature related errors permits the CT 46 to maintain dependable accurate current readings.

With the secondary winding 26 temperature information the monitoring device 30 can also determine potential electrical problems in the primary winding 14 circuit by comparing the determined temperature of the secondary winding 26 with historic data of the CT 46 stored in memory 34. A determined temperature of the secondary winding 26 and its associated sensed current can be compared, by the processor 42, with an expected range of secondary winding 26 temperatures for the same sensed current, stored in the memory 34. If the determined secondary winding 26 temperature is greater than the expected range of secondary winding 26 temperatures for the same sensed current a possible loose electrical connection in the primary winding 14 circuit can be detected by the processor 42. If a comparison, by the processor 42, of several recently stored temperatures of the secondary winding 26 is cyclic between an expected range of temperatures for the sensed currents and temperatures greater than the expected range of temperatures for the sensed current, an indication of an open circuit, phase loss or arcing in the primary winding 14 circuit can be detected by the processor 42. Comparing the measured induce voltage, sensed current and derived temperature with historic data stored in memory 34 can also detect subtle changes over time that could indicate a deteriorating performance of the CT 46 or a need for preventive maintenance. Comparisons to historic data can also detect sudden deviations for the established characterization of the CT 46, indicating a need for more urgent corrective action.

Figure 3:
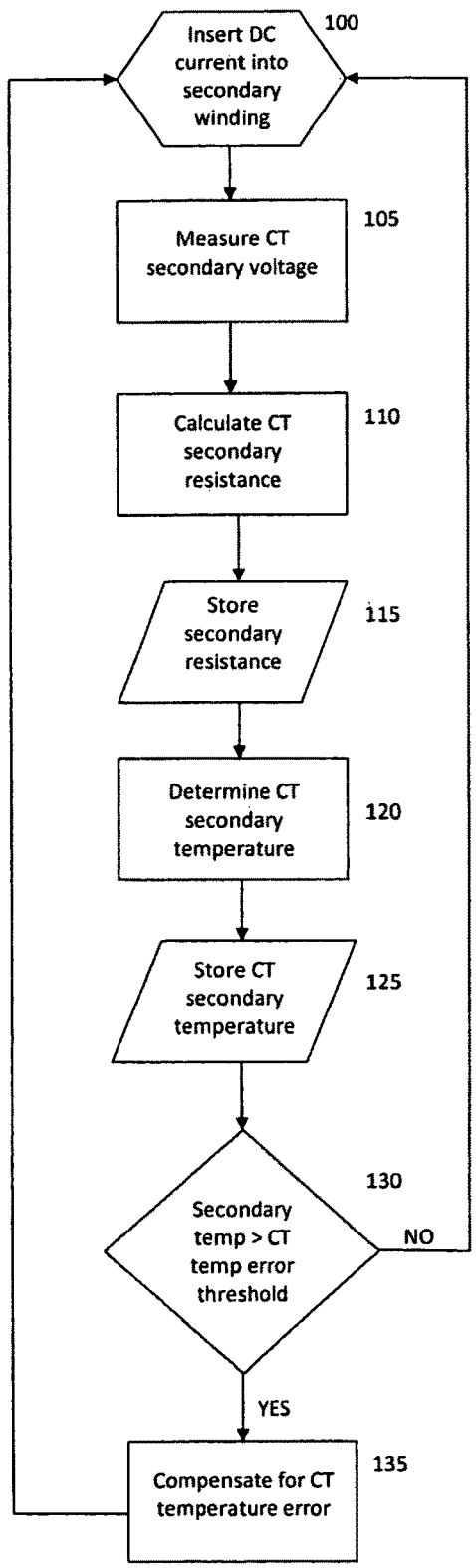
FIG. 3 is a flow chart illustrating the method of determining the temperature of the current transformer secondary winding.

Referring now to FIG. 3, the process for determining the temperature of the secondary winding 26 and if necessary compensating for a temperature induced current sensing error using the determined temperature are described. The following step from an algorithm 38 stored in memory 34 are performed by the processor 42 of the measuring/monitoring device 30. To initiate the temperature sensing function of CT 46 the DC current circuit 50, which can be controlled by the measuring/monitoring circuit 30, injects a known DC current into the secondary winding 26 at step 100. The injected DC current induces a voltage in the secondary winding 26. The induced voltage is measured by the voltage measurement circuit 54 at step 105. At step 110 the resistance of secondary winding 26 is calculated. The secondary, winding 26 resistance can be calculated using information about the voltage induced by the DC current circuit 50 or by using the superposition electrical theorem, where the ADC 62 can measure current sensor output current*burden resistance $R_B$ and current source*(burden resistance $R_B$ current sensor 46 winding 26 resistance). Knowing the burden resistance $R_B$ and the output of the current source 50, the resistance of the current sensor 46 secondary winding 26 can be calculated. The calculated resistance of the secondary winding 26 is stored in memory 34 at step 115. At step 120 the calculated resistance of the secondary winding 26 is used to determine the temperature of the secondary winding 26. The calculated resistance of the secondary winding 26 is compared, by the processor 42, with a resistance/temperature relationship table stored in memory 34. The resistance/temperature relationship table can be based on design characteristics such as the materials used in CT 46 or on a series of resistance measurement of secondary winding 26 taken at controlled temperatures. The resistance/temperature relationship table can also be used as a calibration parameter. At step 125 the determined temperature of secondary winding 26 is stored in memory 34. At step 130 the processor 42 compares the determined temperature of secondary winding 26 with a threshold temperature or range of temperatures previously determined to produce CT 46 current sensing errors. The threshold temperatures can be determined by actual testing or by characteristic of the CT 46, such as materials use in making the CT 46. If the determined temperature of the secondary winding 26 exceeds the previously determined error threshold temperature the processor 42 will determine if there is a current sensing error and compensate as necessary for a detected error at step 135 and then return to step 100. If the determined secondary temperature does not exceed the previously determined CT 46 error threshold temperature at step 130, the processor 42 can return directly to step 100.

Figure 4:
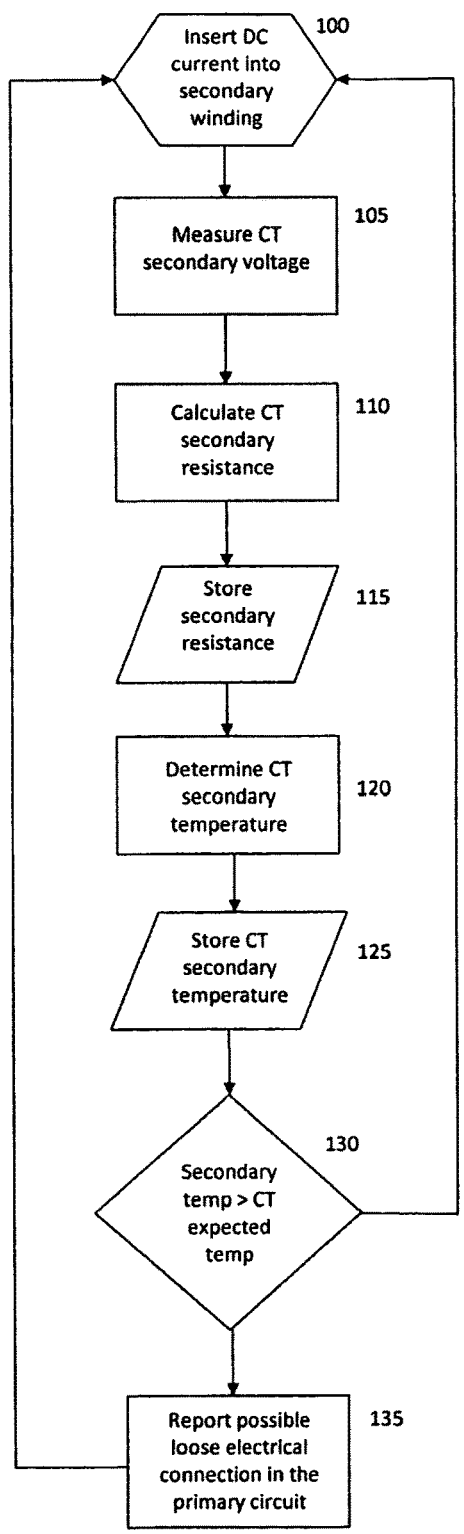
FIG. 4 is a flow chart illustrating the method of determining a possible loose electrical connection in the primary circuit.
Figure 5:
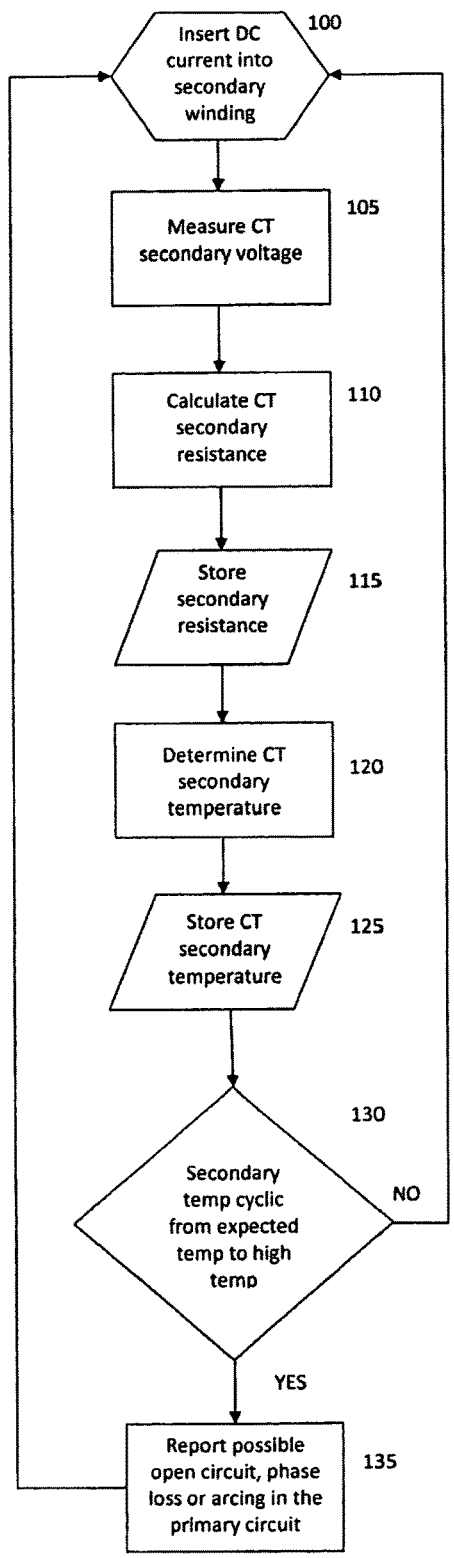
FIG. 5 is a flow chart illustrating the method of determining a possible open circuit, phase loss or arcing in the primary circuit.

Once the temperature of the secondary winding 26 has been determined and stored in memory 34, and any current sensing errors have been resolved, the processor 42 can use the secondary temperature for other diagnostic test. In FIG. 4, using steps 100-125 of the temperature determining algorithm, the processor 42 can compare, at step 130, the determined secondary temperature with a previously determined secondary temperature expected for the current being sensed by the CT 46. If the determined secondary temperature exceeds the expected secondary temperature a possible loose electrical connection can be reported to the monitoring device 30 at step 135. In FIG. 5, using steps 100-125 of the temperature determining algorithm, the processor 42 can compare, at step 130, the determined secondary temperature with recently recorded secondary temperatures to determine if there is a cyclic pattern. If a cyclic temperature pattern of expected secondary temperatures for the current being sensed and secondary temperatures higher than expected is observed a possible open circuit, phase loss or arcing in the primary circuit can be reported to the monitoring device 30 at step 135.

Although specific example embodiments of the invention have been disclosed, persons of skill in the art will appreciate that changes may be made to the details described for the specific example embodiments, without departing from the spirit and the scope of the invention.

We claim:

1. A current transformer (CT) providing both current and temperature measurements comprising:
   a current transformer having a primary winding and a secondary winding;
   a circuit for injecting a DC current into the secondary winding;
   a circuit for measuring a voltage across the secondary winding;
   a processor for calculating a resistance of the secondary winding from the measured voltage;
   a memory for storing the calculated resistance of the secondary winding;
   determining, by the processor, a temperature of the secondary winding; and
   storing the determined temperature of the secondary winding in the memory, the processor using the stored resistance and temperature values of the secondary winding with other stored characteristics of the CT to compensate for temperature related current sensing errors of the CT and to diagnose potential electrical problems in the primary winding of the CT.

2. The current transformer of claim 1, wherein the injected DC current is a known current provided by the circuit for injecting a DC current.

3. The current transformer of claim 1, wherein a voltage is induced into the secondary winding by the injected DC current and measured by the voltage measuring circuit.

4. The current transformer of claim 1, wherein the circuit for measuring the voltage includes a buffer and an analog to digital converter.

5. The current transformer of claim 1, wherein the determining includes comparing the calculated resistance of the secondary winding with a previously recorded resistance of the secondary winding measured at a verified secondary winding temperature.

6. The current transformer of claim 1, wherein the determining includes calculating the temperature of the secondary winding.

7. The current transformer of claim 1, wherein a most recently stored temperature and sensed current of the secondary winding is compared with an expected temperature for the sensed current stored in the memory, if the most recent stored temperature is greater than the expected temperature a possible loose electrical connection in the primary winding can be detected by the processor.

8. The current transformer of claim 1, wherein if a comparison, by the processor, of several recently stored temperatures of the secondary winding are cyclic between a temperature expected for the sensed current and a temperature greater than expected for the sensed current, an indication of arcing in the primary winding can be detected by the processor.

9. The current transformer of claim 1, wherein a most recent stored temperature of the secondary winding is compared with a threshold temperature, stored in the memory, known to affect current sensing accuracy of the CT.

10. The current transformer of claim 9, wherein if the most recent stored temperature of the secondary winding is greater than the threshold temperature the processor accesses data stored in the memory associating a known secondary winding temperature with a known temperature related current sensing error and adjusts accordingly the most recently stored sensed current to compensate for the temperature related current sensing error.

11. A method for determining a temperature of a secondary winding of a current transformer (CT) comprising the steps of:
   injecting a direct current (DC) signal into the secondary winding of the CT;
   measuring a voltage across the secondary winding induced by the injected DC current;
   calculating, by a processor, a resistance of the secondary winding from the measured voltage;
   determining, by the processor, a temperature of the secondary winding;
   storing the calculated resistance and determined temperature of the secondary winding in a memory; and
   using, by the processor, the stored resistance and temperature values of the secondary winding with other stored characteristics of the CT to compensate for temperature related current sensing errors of the CT and to diagnose potential electrical problems in a primary winding of the CT.

12. The method of claim 11, wherein the determining includes comparing the calculated resistance of the secondary winding with a previously recorded resistance of the secondary winding measured at a verified secondary winding temperature.

13. The method of claim 11, wherein the temperature of the secondary winding is calculated.

14. The method of claim 11, wherein diagnosing potential electrical problems in the primary winding of the CT by the processor comprises
   detecting at least one of:
   a temperature related current sensing error and compensating for the temperature related current sensing error,
   a potential loose electrical connection in a primary winding circuit;
   a potential arcing condition in the primary winding circuit;
   a deteriorating performance of the CT;
   a subtle change to the CT, or
   a sudden deviation from the established characterization of the CT.

15. The method of claim 11, wherein the injected DC current is provided by a DC current circuit.

16. The method of claim 15, wherein the DC current circuit is controlled by a measuring/monitoring device such that the injected DC current can be turned off, increased or decreased as required to increase the measurement accuracy.

17. The method of claim 11, wherein the voltage is measured by a voltage measuring circuit.

18. The method of claim 17, wherein the voltage measuring circuit includes a buffer and an analog to digital converter.

* * * * *